United States Patent [19]

Hörler et al.

[11] Patent Number: 4,534,700
[45] Date of Patent: Aug. 13, 1985

[54] EXTERNALLY MOUNTED EXHAUST-GAS TURBOCHARGER WITH UNCOOLED GAS DUCT

[75] Inventors: Hansulrich Hörler, Zurich; Ambrogio Perego, Wettingen, both of Switzerland

[73] Assignee: BBC Brown, Boveri & Company, Limited, Baden, Switzerland

[21] Appl. No.: 569,656

[22] Filed: Jan. 10, 1984

[30] Foreign Application Priority Data

Jan. 18, 1983 [CH] Switzerland ............... 263/83

[51] Int. Cl.³ .................. F01D 25/26; F02C 7/20
[52] U.S. Cl. .................. 415/135; 415/177; 60/39.32
[58] Field of Search .............. 415/134, 135, 136, 137, 415/138, 139, 177, 200, 202, 191, 193; 60/39.32

[56] References Cited

U.S. PATENT DOCUMENTS

| 3,186,168 | 6/1965 | Ormerod et al. | 60/39.32 |
| 3,304,054 | 2/1967 | Oechslin et al. | 415/134 |
| 3,314,648 | 4/1967 | Howald | 415/135 |
| 3,670,497 | 6/1972 | Sheldon | 60/39.32 |
| 3,869,222 | 3/1975 | Rahnke et al. | 415/138 |
| 3,982,390 | 9/1976 | Bell | 60/39.75 |
| 4,177,004 | 12/1979 | Riedmiller et al. | 415/136 |

FOREIGN PATENT DOCUMENTS

| 1220671 | 7/1966 | Fed. Rep. of Germany | 415/138 |
| 0110556 | 10/1925 | Switzerland | 415/135 |

*Primary Examiner*—Robert E. Garrett
*Assistant Examiner*—H. Edward Li
*Attorney, Agent, or Firm*—Burns, Doane, Swecker & Mathis

[57] ABSTRACT

In an exhaust-gas turbocharger having an uncooled gas duct, the hot gas casing is connected to the relatively cooler supporting casing by a supporting member resilient in the radial direction. The supporting member consists of an outer flange and an inner flange and of a diaphragm disposed therebetween and comprising at least one fold and two flanks extending predominantly in the axial direction. The coefficient of thermal expansion of the material of the diaphragm flanks is preferably from 5% to 40% higher than that of the hot gas casing.

4 Claims, 3 Drawing Figures

EXTERNALLY MOUNTED EXHAUST-GAS TURBOCHARGER WITH UNCOOLED GAS DUCT

Field of Invention

The invention relates to an externally mounted exhaust-gas turbocharger having an uncooled gas duct.

Background of the Invention

In order to avoid undesirable thermal stresses and excessively high surface temperatures, the gas duct of large exhaust-gas turbochargers is generally water-cooled. On the other hand, exhaust-gas turbochargers having uncooled gas ducts provide thermodynamic advantages. A prerequisite in this respect is however that the outside temperature of the casing should remain below about 200° C. for reasons of safety. Through the elimination of the removal of heat dissipated in the cooling water, less heat is taken from the exhaust gas of an uncooled turbocharger up to the turbine outlet. Since the upper process temperature is higher, the thermal efficiency of the turbine, and consequently the power delivered to the air compressor for a constaant amount of exhaust gas, are increased. In diesel plants equipped with a waste heat boiler, waste heat is therefore available at a temperature level about 10° to 15° C. higher.

Since the temperature of the hot gas casing is in the region above 500° C., the different heat expansions give rise to steady and unsteady thermal stresses and consequently to constructional problems in connection with the support of the hot gas casing in the supporting casing of an uncooled exhaust-gas turbocharger.

Exhaust-gas turbochargers of the type first mentioned above are known. A typical design is illustrated and described in the journal "Brown Boveri Mitteilungen" No. 5, 1981, Pages 174 and 175.

In this solution the hot gas casing is supported in the supporting casing by means of a flange sliding in the radial direction. With this type of support the prevention of the conduction of heat from the hot gas casing to the supporting casing is very difficult, and consequently the supporting casing has a relatively high surface temperature. Wear can be avoided only with low surface pressure and the use of special material. Gastightness adequate in practice and the avoidance of clatter can be achieved only by means of close manufacturing tolerances and special sealing inserts, which entails considerable expense.

The problem underlying the invention is that of providing, in an exhaust gas turbocharger of the kind first mentioned above, a connection between the hot gas casing and the supporting casing ensuring good centering and low conduction of heat to the suppporting casing.

Summary of the Invention

According to the invention this problem is solved by a simple, gastight and operationally reliable connection between the hot gas casing and the supporting casing, whereby a relatively low outside temperature of the supporting and exhaust gas casings is ensured. The connection is in addition free from play and therefrom from clatter. Both when starting up and during normal operation the thermal stresses occurring remain within acceptable limits. Thus the creep of the material and the occurrence of wear are substantially reduced.

If the fold is reinforced relative to the flanks of the diaphragm, the local stress concentration is substantially reduced. This has a positive influence on the occurrence of fatigue in the material, and thus on the life of the supporting member.

If the coefficient of thermal expansion of the material of the diaphragm flanks is from 5% to 40% higher than that of the material of the hot gas casing, the thermal stresses occurring in the inner flank of the diaphragm in the proximity of the inner flange are reduced during the starting-up period.

Brief Description of the Drawing

Two preferred embodiments of the invention are shown in the drawing, in which.

Figure 1:
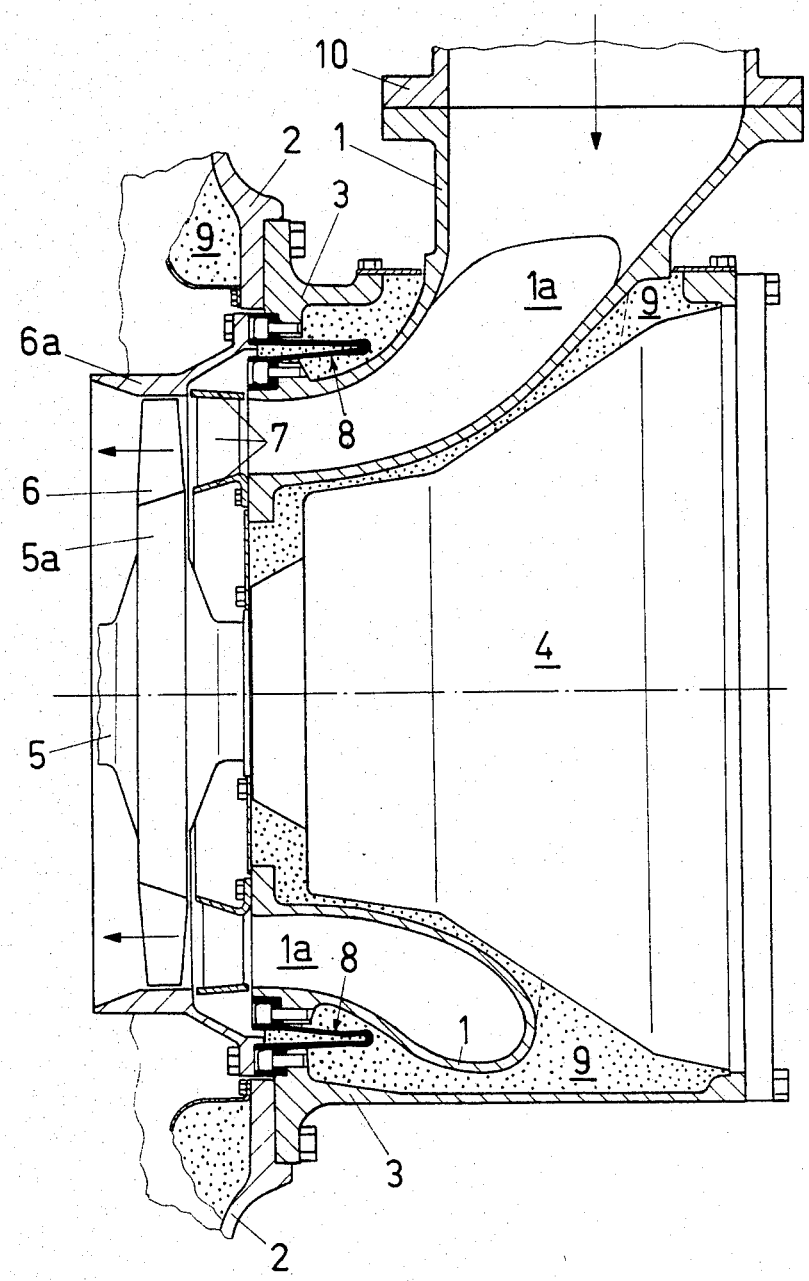
FIG. 1 is a longitudinal section of the turbine of an exhaust-gas turbocharger having a support member in accordance with a preferred embodiment of the present invention.

In the drawings identical parts are given the same reference numerals. The direction of flow of the working medium is indicated by arrows. Parts of the exhaust-gas turbocharger which are essential to the invention, such as for example the air filter, air compressor, turbine exhaust gas duct, brackets, and fastening members, have been omitted.

Detailed Description of the Preferred Embodiments

The axial-flow turbine shown in FIG. 1, forming part of an exhaust-gas turbocharger having an uncooled gas duct, is connected by means of a hot gas casing 1 to the exhaust pipe 10 of a supercharged diesel engine (not shown). A hot gas duct 1a is disposed in the hot gas casing 1. The turbine shaft 5 is mounted in known manner in a bearing casing 4, and carries the wheel 5a equipped with turbine rotor blades 6. The hot gas casing 1 is joined by means of screw connections to the supporting casing 3, and the latter in turn is similarly connected to the exhaust gas casing 2. The bearing casing 4 is fastened to the supporting casing 3 by means of bolts and contains the bearings (not shown in the drawing) of the turbine shaft 5.

In order to be able to keep the operating temperature of the exhaust gas casing 2, the supporting casing 3, and the bearing casing 4 within the desired limits, the cavities between the hot gas casing 1, the supporting casing 3, and the bearing casing 4, and also the interior of the exhaust gas casing 2 are provided with thermal insulation 9, which consists for example of mineral wool.

A vane ring 7 is fastened on the end face of the hot gas casing 1 facing the turbine. A turbine cover ring 6a is joined to the supporting casing 3.

The operating temperature of the hot gas casing 1 amounts to about 500° C. For reasons of safety the outside temperature of the supporting casing 3 and also that of the exhaust gas casing 2 must not exceed a value of 200° C. On starting up the hot gas casing heats up relatively quickly and, relative to the supporting casing, a temperature difference of up to 400° C. is temporarily attained, falling in normal operation to a value of about 300° C.

Thus far, the exhaust-gas turbocharger having an uncooled gas duct is known. According to the invention the hot gas casing 1 is now joined to the supporting casing 3 by means of an annular supporting member 8 which is resilient in the radial direction and which is shown in detail in FIG. 2. The supporting member 8 has at least two diaphragm flanks 8d, 8e which extend predominantly in the axial direction and which at one end are joined together by a fold 8c and at the other end are fastened by respective flanges 8a, 8b to the hot gas casing 1 and the supporting casing 3 respectively, the flanges 8a, 8b lying at least approximately in the same radial plane. In order to avoid the direct transmission of heat from one flange to the other, the narrow space between the two flanks 8d and 8e is thermally insulated. Between the turbine cover ring 6a and the vane ring 7 an axial clearance exists in the cold state, in order to permit the axial displacement of the vane ring 7 which occurs as the result of temperature and/or force influences.

The end face of the hot gas casing 1 facing the turbine must not move more than very slightly in the axial direction, in relation to the supporting casing 3, as the result of temperature and/or force influences, in order to avoid overstressing the vane ring 7, which is fastened internally to the hot gas casing 1 and externally rests on the turbine cover ring 6a in the warm state. This necessitates, inter alia, a firm connection of the hot gas casing 1 to the supporting casing 3 in the proximity of the end face of the hot gas casing 1 facing the turbine.

Since the annular space outside the vane ring 7 is under the full pressure of the engine exhaust gas and the space, filled with thermal insulating material, between the hot gas casing 1 and the supporting casing 3 is under atmospheric pressure, the connection between the hot gas casing and the supporting casing must be fluid-tight.

The resilient supporting member 8 ensures the necessary centering of the hot gas casing 1 in the supporting casing 3, takes all the static and dynamic forces acting on the hot gas casing 1, permits the relative radial expansion of the hot gas casing 1 in relation to the supporting casing 3, and seals the hot gas duct completely against the outside.

Figure 2:
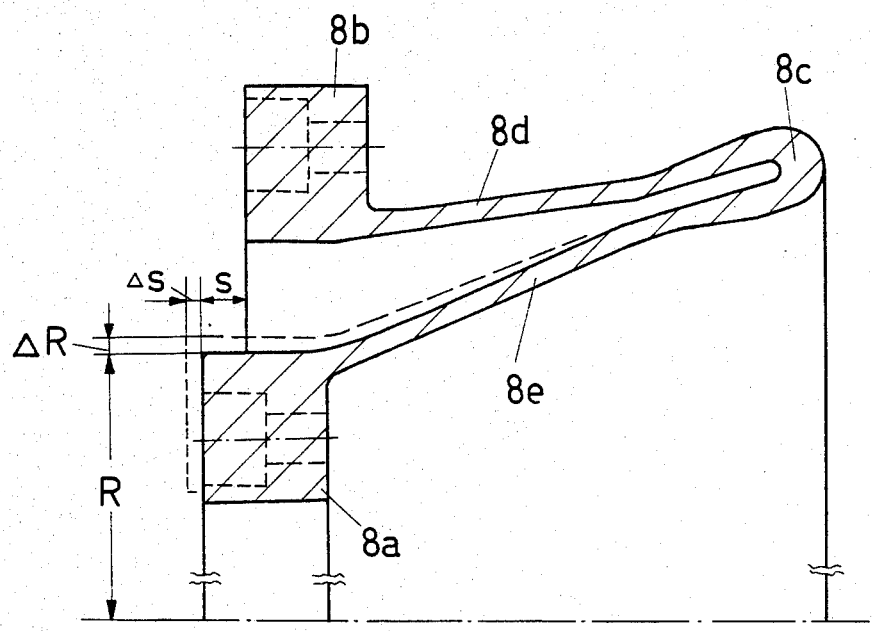
FIG. 2 is a sectional detail of the support member of FIG. 1.

In the modified form of supporting member 8 shown in FIG. 2, the outer flank 8d extends outwards from the outer flange 8b roughly in the shape of a lateral area of a cone, and after the fold 8c the inner flank 8e extends inwards in the shape of a lateral area of a cone, back to the inner flange 8a. The diaphragm flanks 8d, 8e, 8f and (the latter shown in FIG. 3) each form the lateral area of truncated cones of different inclinations, the ends facing the turbine lying on the smaller diameter. The fold 8c is bent back in order to limit the bending stress and has a greater thickness than the diaphragm flanks. The contour of the inner part of the supporting member 8 at operating temperature is shown schematically as a broken line, with an axial thermal expansion ΔS and a radial thermal expansion ΔR. The axial thermal expansion ΔS corresponds approximately to the axial clearance in the cold state between the turbine cover ring 6a and the vane ring 7. In order to achieve torsional stiffness, the two flanges 8a and 8b are made robust.

However, excessively solid construction of the inner flange 8a and of the fold portion 8c is undesirable because of thermal inertia. On the other hand, it is necessary for the assumed linear temperature distribution from the inner flange 8a to the outer flange 8b to be achieved as quickly as possible in transient processes. In this case the stresses occurring in the supporting member 8, which mainly arise from the load of the thermal expansion of the hot gas casing 1, irregular thermal expansion of the supporting member itself, and from the gas forces acting on the hot gas casing 1, can be kept below the elastic limit of the material used.

The mode of operation of the exhaust-gas turbocharger can be seen from the following description: The exhaust gas flows through the hot gas duct 1a and the vane ring 7 to the turbine rotor blades 6, in which it expands to deliver power and is then ejected through an exhaust pipe (not shown) into a downstream preheating boiler (not shown).

Since good thermal contact exists between the hot gas casing 1 and the inner flange 8a, the inner flange 8a heats up, when the engine is started, and expands radially, together with the hot gas casing 1, relatively quickly by the value ΔR, measured on the outer radius R of the inner flange 8a.

In the steady state of operation of the engine an approximately linear temperature distribution from the inner flange 8a by way of the diaphragms 8e, 8c, 8d to the outer flange 8b is adjusted. Since the inner flank 8e is hotter than the outer flank 8d, the inner flange 8a is displaced, because of the thermal expansion, in the direction of the turbine by the value ΔS, so that the vane ring lies against the end face, provided for the purpose, of the turbine cover ring 6a.

In this case the inner flange 8a projects the distance S further than the outer flange 8b. The two flanks 8d and 8e accordingly have different lengths. The length of the flanks 8d, 8e has a part to play in connection with the axial thermal expansion ΔS. In principle the length of the inner flank 8e may be greater or smaller than that of the outer flank 8d. Depending on the ratio of the lengths of the outer and inner flanks, the axial thermal expansion ΔS may either have a finite positive value in the direction of the turbine or be equal to zero when the inner flank 8e is accordingly shorter than the outer flank 8d.

The two flanges 8a and 8b are provided with screw holes for fastening the supporting member 8 to the hot gas casing 1 and the supporting casing 3 respectively.

The shape of the supporting member 8 may for example be obtained by casting or by two-part turning followed by electron beam welding in the region of the fold 8c. In order to achieve a constant temperature drop over the entire length of the diaphragms 8c, 8d, 8e, at least during steady state operation, the diaphragm is provided on all sides with thermal insulating material 9.

Because of the operating temperatures and the stresses which occur, an alloyed steel should be used for the supporting member. A reduction of the thermal stresses, particularly during the starting-up period, can be achieved in the region of the inner flange 8a and inner flank 8e if the coefficient of thermal expansion of the material of the diaphragm flanks 8d, 8e is from 5% to 40% higher than that of the material of the hot gas casing 1.

The hot gas casing 1 can be formed of suitable conventional materials which satisfy the criteria of GG20 and GGG40 which are standard designations of cast alloys in the German industry (i.e., DIN designations). The GG20 cast is essentially identical to ASTM A48-76 Class 35b, 30b, and GGG40 is essentially identical to ASTM A 536-77, Grade 65/45/12.

The support 8 can be formed of suitable conventional materials such as St T 16/25 Mo (essentially identical to ASTM A 638-81 Grade 660 Typ 2); Ni80TiAl (essentially identical to ASTM B 637-80 Alloy N 07080; and St 460 TS (essentially identical to ASTM 193-81a Grade B16).

Figure 3:
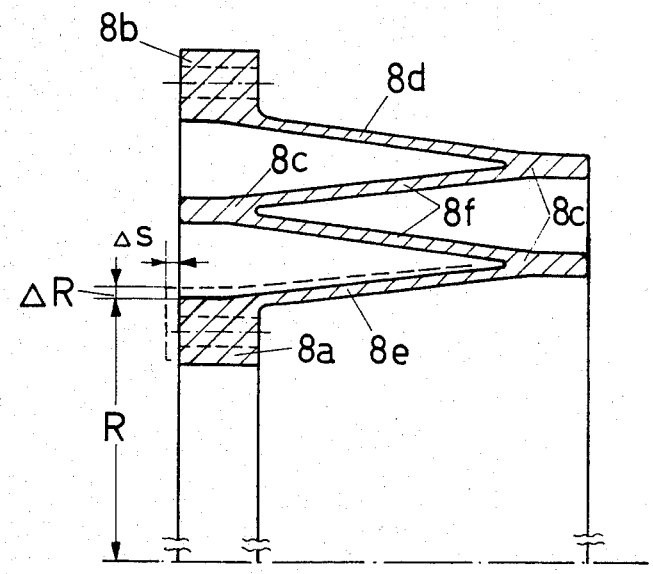
FIG. 3 is a sectional detail of another preferred embodiment of the support member in accordance with the present invention.

FIG. 3 shows another form of construction of the supporting member 8, which has three folds 8c and four flanks 8d, 8e, 8f, the two flanges 8a and 8b lying in the same radial plane.

If the diaphragm 8c, 8d, 8e, 8f of the supporting member 8 has more than one fold 8c, the advantage is gained that, while thermal stresses are lower, the axial thermal expansion ΔS of that end face of the hot gas casing which faces the turbine is lower in the direction of the turbine rotor. This is due to the fact that the length of the flank 8e, which determines the axial thermal expansion, is relatively lower in comparison with that of a supporting member having one fold and two flanks. Depending on the construction of the supporting casing 3 and of the hot gas casing 1, it is also possible to construct the supporting member 8 with two folds 8c and accordingly with three flanks 8d, 8e, 8f. In this case the two flanges 8a and 8b lie in two different radial planes lying at a distance from one another equal to the flank length.

The advantage of the invention is to be seen particularly in the fact that the indirect connection of the hot gas casing 1 to the supporting casing 3 by means of a resilient supporting member 8 enables not only good centering and gastightness but also a relatively low transfer of heat to the supporting casing 3 and therefore a relatively low outside temperature to be achieved. Steady and unsteady thermal stresses and also the occurrence of wear are largely controlled, and thus there is a positive influence on the life of the turbocharger.

The invention is obviously not restricted to what is shown in the drawings and described above. It also includes, for example, other types of turbo machines in which constructional problems arise in respect of differential radial expansion because of the supporting of a hot casing in a cold casing. Thus, it is to be understood that the present invention may be embodied in other specific forms without departing from the spirit or essential characteristics of the present invention. The preferred embodiments are therefore to be considered illustrative and not restrictive. The scope of the invention is indicated by the appended claims rather than by the foregoing descriptions and all changes or variations which fall within the meaning and range of the claims are therefore intended to be embraced therein.

What is claimed:

1. In an externally mounted exhaust gas turbocharger of the type comprising a rigid support casing, a turbine shaft, a bearing casing carrying said turbine shaft and attached to said support casing, and an uncooled gas casing defining a duct for supplying exhaust gas, said gas casing being attached to said supporting casing by connecting means which permits said gas casing to expand radially relative to said support casing, the improvement wherein said connecting means comprises an annular supporting member which is resilient in the radial direction and which includes at least two diaphragm flanks which extend predominantly in the axial direction and which are joined together on one end by a fold and are connected at the other end by respective flanges to the hot gas casing and the supporting casing, respectively, said flanges lying at least approximately in a common radial plane; the coefficient of thermal expansion of the material of the diaphragm flanks being from 5 to 40% higher than that of the material of the hot gas casing.

2. In an apparatus according to claim 1, wherein said flanges are disposed at an end of said supporting member which faces the turbine, said diaphragm flanks projecting from said flanges in a direction away from said turbine.

3. In an apparatus according to claim 1, wherein at least some of said flanks each form a truncated cone, the end thereof which faces said turbine being of smaller diameter than the other end.

4. In an apparatus according to claim 1, wherein said fold is bent back in order to limit the bending stress and has a greater thickness than the diaphragm flanks.

* * * * *